United States Patent
Rhee et al.

(10) Patent No.: US 10,109,459 B1
(45) Date of Patent: Oct. 23, 2018

(54) SUBSTRATE TREATING APPARATUS, SUBSTRATE TREATING METHOD, AND PLASMA GENERATING UNIT

(71) Applicant: PSK INC., Gyeonggi-do (KR)

(72) Inventors: Han Saem Rhee, Gyeonggi-do (KR); Sung Jin Yoon, Gyeonggi-do (KR); Dong Hoon Kim, Gyeonggi-do (KR)

(73) Assignee: PSK INC., Gyeonggi-Do (KR)

( * ) Notice: Subject to any disclaimer, the term of this patent is extended or adjusted under 35 U.S.C. 154(b) by 0 days.

(21) Appl. No.: 15/683,835

(22) Filed: Aug. 23, 2017

(30) Foreign Application Priority Data

Aug. 11, 2017 (KR) .................. 10-2017-0102369

(51) Int. Cl.
*H01J 37/32* (2006.01)

(52) U.S. Cl.
CPC .. *H01J 37/32091* (2013.01); *H01J 37/32165* (2013.01); *H01J 37/3211* (2013.01); *H01J 37/32174* (2013.01)

(58) Field of Classification Search
CPC ...... B08B 5/00; B23K 10/00; B23K 2201/40; B23K 9/013; C23C 16/452; C23C 16/453; C23C 16/455; C23C 16/45557; C23C 16/458; C23C 16/4584; C23C 16/4586; C23C 16/50; C23C 16/505; C23C 16/515; C23C 16/52; H01F 38/10; H01F 38/14; H01J 2237/332; H01J 2237/334; H01J 37/32091; H01J 37/321; H01J 37/3211; H01J 37/32146; H01J 37/32165; H01J 37/32174; H01J 37/32357; H01J 37/3244; H01J 37/32458; H01J 37/32477; H01J 37/32541; H01J 37/32577; H01J 37/32724; H01J 37/32972; H01L 21/02087; H01L 21/0209; H01L 21/28176; H01L 21/3105; (Continued)

(56) References Cited

U.S. PATENT DOCUMENTS

| 6,475,334 | B1* | 11/2002 | Harano | H01J 37/321 118/723 I |
| 2002/0041160 | A1* | 4/2002 | Barnes | H01J 37/321 315/111.21 |

(Continued)

FOREIGN PATENT DOCUMENTS

| JP | H07-57893 A | 3/1995 |
| JP | H08-139070 A | 5/1996 |

(Continued)

*Primary Examiner* — Alexander H Taningco
*Assistant Examiner* — Renan Luque
(74) *Attorney, Agent, or Firm* — Li & Cai Intellectual Property (USA) Office (57) ABSTRACT

Disclosed are a substrate treating The substrate treating apparatus includes a plasma generating unit the plasma generating unit includes a plasma generating chamber having a space, into which a gas is introduced, a first antenna wound to surround the plasma generating chamber and connected to a power source through a first electric wire, a second antenna wound to surround the housing and connected to the power source through a second electric wire to be disposed in parallel to the first antenna, and power distributing members provided in the first antenna and the second antenna to distribute electric power supplied from the power source to the first antenna and the second antenna.

23 Claims, 6 Drawing Sheets

(58) Field of Classification Search
CPC ......... H01L 21/31116; H01L 21/31138; H01L 21/32136; H01L 21/67253; H01L 29/517; H01L 21/02; H01L 21/302; H01L 21/306; H01L 21/3065; H05H 1/46; H05H 2001/4667; H05H 2001/4682
See application file for complete search history.

(56) References Cited

U.S. PATENT DOCUMENTS

| | | | | |
|---|---|---|---|---|
| 2009/0229522 A1* | 9/2009 | Nishimura | ............ | H01J 37/321 118/723 R |
| 2009/0314434 A1* | 12/2009 | Song | ............ | H01J 37/321 156/345.48 |
| 2011/0133650 A1* | 6/2011 | Kim | ............ | H01J 37/32091 315/111.21 |
| 2011/0198032 A1* | 8/2011 | Woo | ............ | H01J 37/321 156/345.1 |
| 2012/0097646 A1* | 4/2012 | Benjamin | ............ | B23K 9/013 219/121.48 |
| 2013/0319615 A1* | 12/2013 | Cho | ............ | B08B 5/00 156/345.29 |
| 2014/0190635 A1* | 7/2014 | Lee | ............ | H01J 37/321 156/345.48 |
| 2014/0263181 A1* | 9/2014 | Park | ............ | C23C 16/45557 216/68 |
| 2015/0311038 A1* | 10/2015 | Park | ............ | H01J 37/3211 156/345.48 |
| 2016/0293390 A1* | 10/2016 | Miura | ............ | H01J 37/32972 |
| 2016/0358781 A1* | 12/2016 | Liu | ............ | H01L 21/28176 |

FOREIGN PATENT DOCUMENTS

| | | |
|---|---|---|
| JP | 2004-509429 A | 3/2004 |
| JP | 2005-347277 A | 12/2005 |
| JP | 2014-500577 A | 1/2014 |
| JP | 2014-216318 A | 11/2014 |
| KR | 1020170012757 | 2/2017 |

\* cited by examiner

SUBSTRATE TREATING APPARATUS, SUBSTRATE TREATING METHOD, AND PLASMA GENERATING UNIT

CROSS-REFERENCE TO RELATED APPLICATIONS

A claim for priority under 35 U.S.C. § 119 is made to Korean Patent Application No. 10-2017-0102369 filed on Aug. 11, 2017, in the Korean Intellectual Property Office, the entire contents of which are hereby incorporated by reference.

BACKGROUND

Embodiments of the inventive concept described herein relate to a substrate treating apparatus, a substrate treating method, and a plasma generating unit.

Plasma corresponds to an ionized gas including ions, electrons, radicals, and the like. The plasma is generated by very high temperature, strong electric fields, or radio frequency (RF) electromagnetic fields.

The plasma is used for treating a substrate to manufacture a semiconductor device. For example, the plasma may be utilized in a lithographic process that uses photoresist. As an example, the plasma may be utilized when various fine circuit patterns such as lines or space patterns on a substrate are formed or during an ashing process of removing a photoresist film used for a mask in an ion implantation process.

Generally, a substrate treating apparatus includes a plasma generating apparatus. The plasma generating apparatus includes an antenna member. The antenna member generates electromagnetic fields. The generated electromagnetic fields excite a process gas into a plasma state.

SUMMARY

Embodiments of the inventive concept provide a substrate treating apparatus that efficiently treats a substrate, a substrate treating method, and a plasma generating unit.

Embodiments of the inventive concept also provide a substrate treating apparatus that efficiently excites plasma, a substrate treating method, and a plasma generating unit.

Embodiments of the inventive concept also provide a substrate treating apparatus that may control heat generated in a process of exciting plasma, a substrate treating method, and a plasma generating unit.

In accordance with an aspect of the inventive concept, there is provided a substrate treating apparatus including a housing configured to provide a treatment space, in which a substrate is treated, a support unit configured to support a substrate in the treatment space, and a plasma generating unit disposed outside the housing and configured to excite plasma from a gas and supply the excited plasma to the treatment space, wherein the plasma generating unit includes a plasma generating chamber having a space, into which a gas is introduced, a first antenna wound to surround the plasma generating chamber and connected to a power source through a first electric wire, a second antenna wound to surround the housing and connected to the power source through a second electric wire to be disposed in parallel to the first antenna, and power distributing members provided in the first antenna and the second antenna to distribute electric power supplied from the power source to the first antenna and the second antenna.

The power distributing members may be variable capacitors.

The substrate treating apparatus may further include a matching circuit located in a main electric wire connecting the power source to the first electric wire and the second electric wire.

The power distributing members may include a first variable capacitor located in the first electric wire, and a second variable capacitor located in the second electric wire.

The first antenna may be wound a plurality of times from a first location to a second location, and the second antenna may be wound a plurality of times from a third location to a fourth location, and the first location may be higher than the second location, and the third location may be between the first location and the second location.

The fourth location may be higher than the second location.

Intervals between windings of the first antenna may be the same, intervals between windings of the second antenna may be the same, and the intervals between the windings of the second antenna may be smaller than the intervals of the windings of the first antenna.

The second antenna may start to be wound in the same direction as the first antenna with respect to a direction of a circumference of the plasma generating chamber.

The second antenna may start to be wound at a location that is 180° away from a point at which the first antenna starts to be wound with respect to a direction of a circumference of the plasma generating chamber.

The substrate treating apparatus may further include a controller configured to control the power distributing members such that ignition of plasma is initiated while electric power applied to the first antenna is higher than electric power applied to the second antenna.

The controller may decreases the electric power applied to the first antenna and may increase the electric power applied to the second antenna if a preset time period elapses after the ignition of the plasma is initiated.

The controller may control the power distributing member such that the electric power applied to the first antenna is higher than the electric power applied to the second antenna if a preset time period elapses after the ignition of the plasma is initiated.

In accordance with another aspect of the inventive concept, there is provided a substrate treating method including initiating ignition of plasma by applying electric power, which is higher than electric power applied to a second antenna, to a first antenna, and if a preset time period elapses after the ignition of the plasma is initiated, decreasing the electric power applied to the first antenna and increasing the electric power applied to the second antenna connected in parallel to the first antenna.

A length from an upper end to a lower end of the first antenna may be shorter than a length from an upper end to a lower end of the second antenna.

The ignition of the plasma may be initiated while the electric power applied to the first antenna is maximized and the electric power applied to the second antenna is minimized.

If the ignition of the plasma is initiated and a preset time period elapses, the electric power applied to the first antenna may be minimized and the electric power applied to the second antenna may be maximized.

Electric power may be distributed to the first antenna and the second antenna by using variable capacitors.

Electric power may be distributed to the first antenna and the second antenna by using a first variable capacitor connected in series to the first antenna and a second variable capacitor connected in series to the second antenna.

In accordance with another aspect of the inventive concept, there is provided a plasma generating unit including a plasma generating chamber having a space, into which a gas is introduced, a first antenna wound to surround the plasma generating chamber and connected to a power source through a first electric wire, a second antenna wound to surround the housing and connected to the power source through a second electric wire to be disposed in parallel to the first antenna, and power distributing members provided in the first antenna and the second antenna to distribute electric power supplied from the power source to the first antenna and the second antenna.

The power distributing members may include a first variable capacitor located in the first electric wire, and a second variable capacitor located in the second electric wire.

The plasma generating unit may further include a controller configured to control the power distributing members such that ignition of plasma is initiated while electric power applied to the first antenna is higher than electric power applied to the second antenna.

The controller may decrease the electric power applied to the first antenna and may increase the electric power applied to the second antenna if a preset time period elapses after the ignition of the plasma is initiated.

A length between an upper end and a lower end of the first antenna may be shorter than a length between an upper end and a lower end of the second antenna.

The power distributing members may include a first switch located in the first electric wire, and a second switch located in the second electric wire.

The plasma generating unit may further include a controller configured to perform a control such that the second switch is switched on if a preset time period elapses after ignition of plasma is initiated while the first switch is switched on and the second switch is switched off.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

Figure 1:
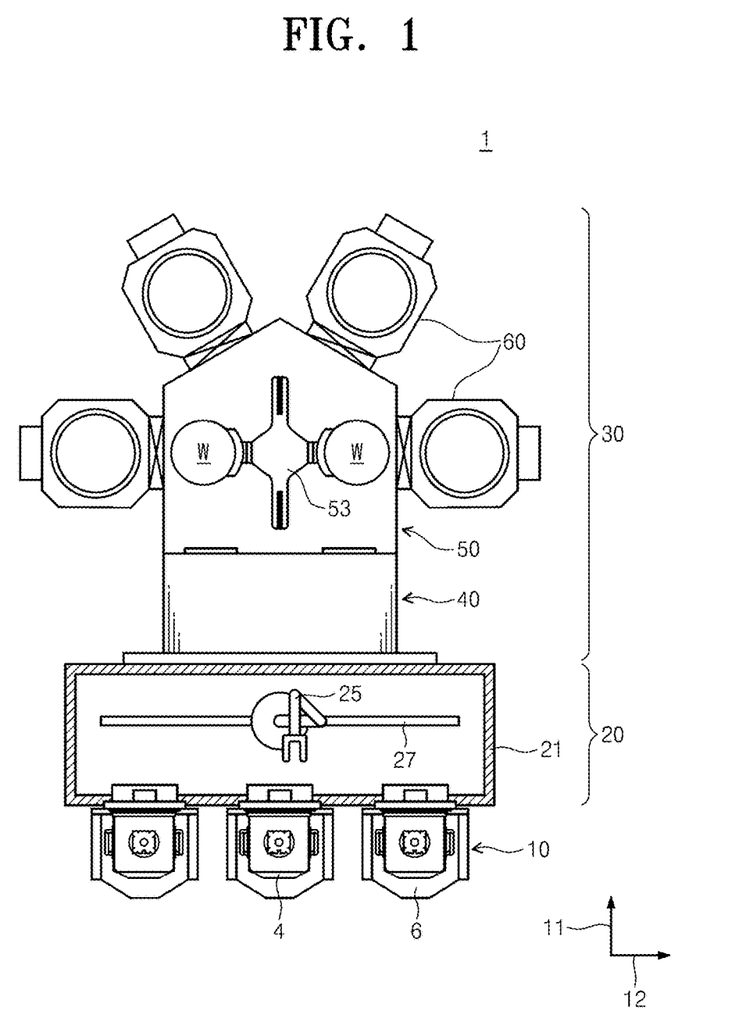
FIG. 1 is a plan view illustrating a substrate treating apparatus according to an embodiment of the inventive concept.

FIG. 1 is a plan view illustrating a substrate treating apparatus according to an embodiment of the inventive concept.

Referring to FIG. 1, the substrate treating apparatus 1 has an equipment front end module (EFEM) 20 and a process executing unit 30. The equipment front end module 20 and the process executing unit 30 are disposed in one direction. Hereafter, a direction in which the equipment front end module 20 and the process executing unit 30 are arranged will be referred to as a first direction 11, and a direction that is perpendicular to the first direction 11 when viewed from the top will be referred to as a second direction 12.

The equipment front end module 20 has a load port 10 and a feeding frame 21. The load port 10 is disposed in front of the equipment front end module 20 in the first direction 11. The load port 10 has a plurality of supports 6. The supports 6 are disposed in a row in the second direction 12, and substrates W, which are to be provided to a process and carriers 4 (for example, cassettes or FOUPs), in which the substrates W, the processes of which have been executed, are located in the supports 6. Substrates W, which are be provided to processes, and substrate W, the processes of which have been executed, are received in the carriers 4. The feeding frame 21 is disposed between the load port 10 and a process executing chamber 30. The feeding frame 21 includes a first feeding robot 25 disposed in the interior thereof and configured to feed a substrate W between the load port 10 and the process executing unit 30. The first feeding robot 25 moves along a feeding rail 27 provided in the second direction 12 and feeds a substrate W between the carrier 4 and the process executing chamber 30.

The process executing chamber 30 includes a load lock chamber 40, a transfer chamber 50, and a process chamber 60.

The load lock chamber 40 is disposed adjacent to the feeding frame 21. As an example, the load lock chamber 40 may be disposed between the transfer chamber 50 and the equipment front end module 20. The load lock chamber 40 provides a spaces in which a substrate W, which is to be provided to a process, stands by before the substrate W is fed to the process chamber 60 or before the substrate W, a process of which has been executed, is fed to the equipment front end module 20.

The transfer chamber 50 is disposed adjacent to the load lock chamber 40. The transfer chamber 50 has a body that is polygonal when viewed from the top. Referring to FIG. 1, the transfer chamber 50 has a body that is pentagonal when viewed from the top. The load lock chamber 40 and a plurality of process chambers 60 are disposed outside the body along a circumference of the body. passages (not illustrated) through which the substrate W is introduced and extracted are formed in side walls of the body, and the passages connect the transfer chamber 50 and the load lock chamber 40 or the process chambers 60. Each of the passages is provided with a door (not illustrated) that seals the interior of the passage by opening and closing the passage. A second feeding robot 53 that feeds the substrate W between the load lock chamber 40 and the process chambers 60 is disposed in an interior space of the transfer chamber 50. The second feeding robot 53 feeds an untreated substrate that stands by in the load lock chamber 40 to the process chamber 60 or feeds a substrate W, a process of which has been executed, to the load lock chamber 40. Further, the substrate W is fed between the process chambers 60 to sequentially provide the substrate W to the plurality of process chambers 60. As illustrated in FIG. 1, when the transfer chamber 50 has a pentagonal body, the load lock chamber 40 is disposed on a side wall that is adjacent to the equipment front end module 20 and the process chambers 60 are continuously disposed on the remaining side walls. The transfer chamber 50 may be provided in various forms according to the process module required, as well as in the above-described shape.

The process chambers 60 are disposed along the circumference of the transfer chamber 50. A plurality of process chambers 60 may be provided. The processes for the substrate W are executed in the process chambers 60. The process chamber 60 receives a substrate W from the second feeding robot 53 and executes a process, and provides the substrate W, the process of which has been executed, to the second feeding robot 53. The processes executed in the process chambers 60 may be different. The process executed by the chamber 60 may be one of the processes of producing a semiconductor device or a display panel by using a substrate W. For example, the process executed by the process chamber 60 may be one of processes, such as a deposition process, an etching process, a cleaning process, a development process, an ashing process, and a bake process. Hereinafter, a case in which the process chamber 60 includes a process module 100 (see FIG. 2) that treats a substrate W by using plasma will be described as an example.

Figure 2:
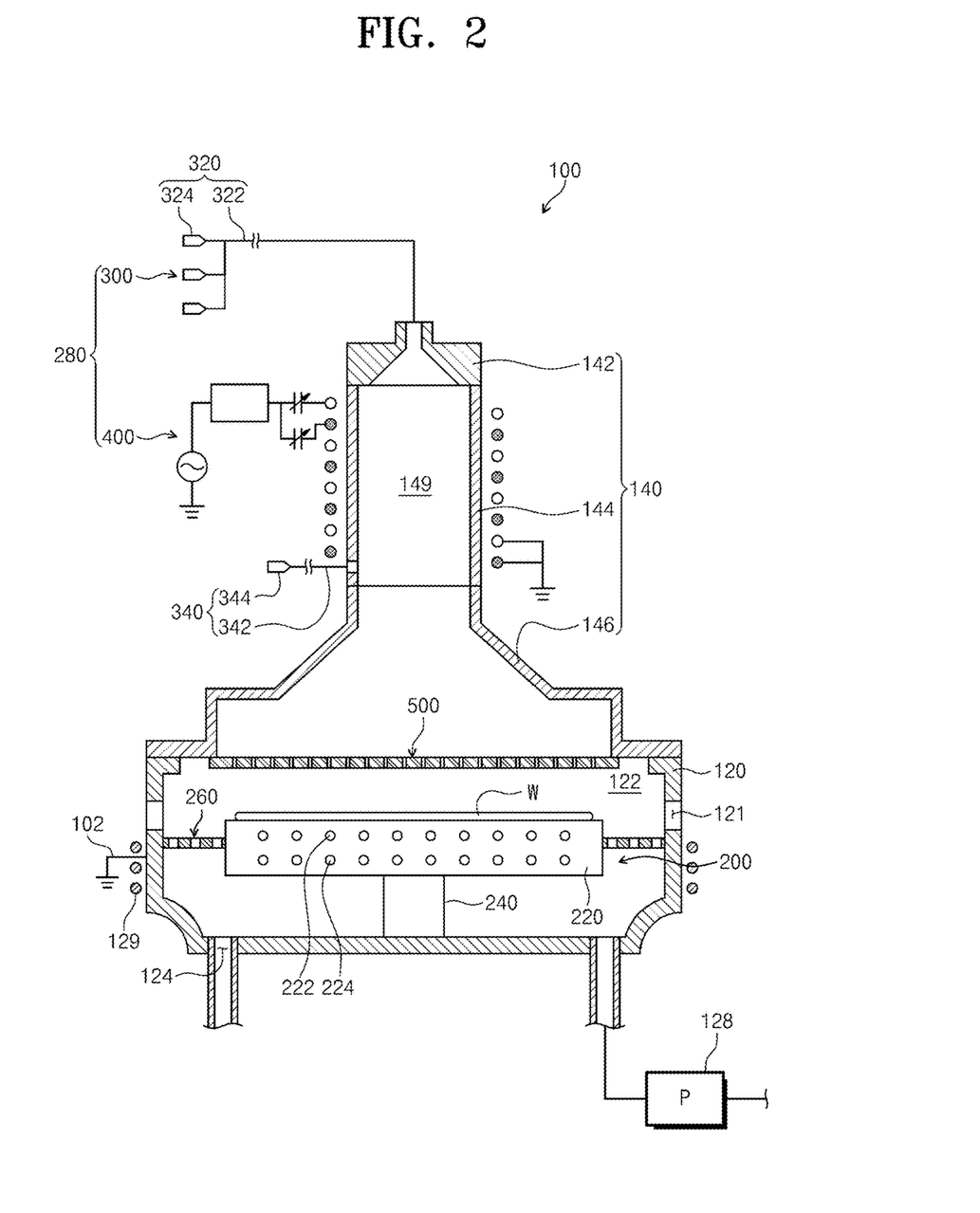
FIG. 2 is a view illustrating a process module that may be provided in a process chamber of FIG. 1.

FIG. 2 is a view illustrating a process module that may be provided in a process chamber of FIG. 1.

Referring to FIG. 2, the process module 100 may be located in the process chamber 60. The process module 100 treats the substrate W by using plasma. As an example, the process module 100 may etch a thin film on the substrate W. The thin film may be various kinds of films, such as a poly silicon film, a silicon oxide film, and a silicon nitride film. Further, the thin film may be a natural oxide film or an oxide film produced chemically.

The process module 100 includes a housing 120, a plasma generating chamber 140, a support unit 200, and a process gas supply unit 280.

The housing 120 provides a treatment space 122 in which a substrate W is treated by plasma. The housing 120 has a space 122, an upper side of which is opened, in the interior thereof. The housing 120 may have a substantially cylindrical shape. An opening 120 is formed on a side wall of the housing 121. The substrate W is introduced into and extracted from the interior of the housing 120 through the opening 121. The opening 121 is opened and closed by an opening/closing member, such as a door (not illustrated). The opening/closing member closes while the substrate W is treated in the housing 120, and opens the opening 121 while the substrate W is carried into and carried out of the interior of the housing 120.

An exhaust hole 124 is formed on a bottom surface of the housing 120. An exhaust line 124 is connected to the exhaust hole 124. A pump 128 is installed in the exhaust line 126. The pump 128 adjusts a pressure in the housing 120 to a process pressure. Residual gases and reaction by-products in the housing 120 are discharged to the outside of the housing 120 through the exhaust line 126. Then, the gases and reaction side-products that stay in the interior of the housing 120 may be introduced into the exhaust hole 124 via holes of the exhaust plate 260. A wall heater 129 may be provided outside the housing 120. The wall heater 129 may have a coil shape. Selectively, the wall heater 129 may be provided inside a side wall of the process chamber 60.

The plasma generating chamber 140 provides a space 149 in which plasma is generated from a process gas. The plasma generating chamber 140 functions as a plasma generating unit together with an antenna unit 400. The plasma generating chamber 140 is located outside the housing 120. According to an embodiment, the plasma generating chamber 140 is located on the upper side of the housing 120 and is coupled to the housing 120. The plasma generating chamber 140 has a gas port 142, a discharge chamber 144, and a diffusion chamber 146. The gas port 142, the discharge chamber 144, and the diffusion chamber 146 are sequentially provided in a direction that extends from the top to the bottom. The gas port 142 receives a gas from the outside. The discharge chamber 144 has a hollow cylindrical shape. When viewed from the top, the space 149 in the discharge chamber 144 may be narrower than the space 121 in the housing 120. Plasma is generated from the gas in the discharge chamber 144. The diffusion chamber 146 supplies the plasma generated in the discharge chamber 144 to the housing 120. The space in the diffusion chamber 146 has a part that becomes gradually wider as it goes downwards. A lower end of the diffusion chamber 146 is coupled to an upper end of the housing 120, and a sealing member (not illustrated) is provided between the diffusion chamber 144 and the housing 120 for sealing from the outside.

Both the housing 120 and the plasma generating chamber 140 may be formed of a conductive material. As an example, the housing 120 and the plasma generating chamber 140 may be formed of an aluminum material. Selectively, the housing 120 and the plasma generating chamber 140 may be formed of a metallic material and a non-metallic material together. As an example, the metallic material may be aluminum (Al) the non-metallic material may be $Al_2O_3$.

The support unit 200 supports the substrate W. The support unit 200 has a support plate 220 and a support shaft 240. The support plate 220 is located in the treatment chamber 122 and has a disk shape. The support plate 220 is supported by the support shaft 240. The substrate W is positioned on an upper surface of the support plate 220. An electrode (not illustrated) may be provided in the interior of the support plate 220, and the substrate W may be fixed to the support plate 220 through an electrostatic force. Selectively, the substrate W may be fixed to the support plate 220 by a mechanical clamp, or may be positioned on the support plate 220 without using a separate fixing unit. A heating member 222 may be provided in the interior of the support plate 220. According to an example, the heating member 222 may be a heating wire. Further, a cooling member 224 may be provided in the interior of the support plate 220. The cooling member 224 may be a cooling line, through which cooling water flows. The heating member 222 heats the substrate W to a preset temperature, and the cooling member 224 compulsorily cools the substrate W. Selectively, the process module 100 may not be provided with a heating member 222 or a cooling member 224. The support unit 200 may have lift holes (not illustrated). A lift pin (not illustrated) is provided in each of the lift holes. When the substrate W is loaded on or unloaded from the support unit 200, the lift pins elevates along the lift holes.

Further, the exhaust plate 260 may be located in the treatment space 122 of the housing 120. As an example, the exhaust plate 260 may be provided to connect the support unit 200 and an inner surface of the housing 120. Unlike this, the exhaust plate 260 may be provided to connect the inner surface of the housing 120 and the lift pin (not illustrated).

The exhaust plate 260 includes a hole. The exhaust plate 260 may exhaust the gases and reaction side-products residing in the housing 120 to the exhaust hole 124. Further, the exhaust plate 260 may not be provided in the treatment space 122 of the housing 120.

The process gas supply unit 280 has a gas supply unit 300 and a plasma source 400. The process gas supply unit 280 supplies the process gas in the plasma state to the interior of the process module 100.

The gas supply unit 300 has a gas supply member 320 and an additional gas supply member 340.

The gas supply member 320 has a gas supply line 322 and a gas storage unit 324. The gas supply line 322 is coupled to the gas port 142. The gas supplied through the gas port 142 is introduced into the discharge chamber 144, and is excited into plasma in the discharge chamber 144. The gas may include difluoromethane ($CH_2F_2$), nitrogen ($N_2$), and oxygen ($O_2$). Selectively, the gas may further include another kind of gas, such as tetrafluoromethane ($CF_4$).

The additional gas supply member 340 has an additional gas supply line 342 and an additional gas storage unit 344. The additional gas is supplied onto a path along which the plasma generated from the gas flows to the housing 120. As an example, the additional gas supply line 342 is coupled to the discharge chamber 144 in an area below the antenna 420, which will be described below. A second source gas may include nitrogen trifluoride ($NF_3$).

Due to the above-mentioned structure, the gas is directly excited into plasma by electric power, and the additional gas is excited into plasma through a reaction with the gas.

In the above-mentioned example, the kinds of the gas and the additional gas may be variously changed. Further, only the gas supply member 320 may be provided while the additional gas supply member 340 is not provided.

The antenna unit excites the first gas into a plasma state.

A baffle 500 is located between the housing 120 and the plasma generating chamber 140. The baffle 500 includes a baffle hole. The baffle 500 uniformly maintains the density and flows of the plasma in the entire area in the housing 120 when the plasma is supplied to the substrate W. The plasma may be supplied through the baffle hole 522. The baffle 500 is grounded. According an example, the baffle 500 may contact the process chamber 60 to be grounded through the process chamber 60. Selectively, the baffle 500 may be directly connected to a separate ground line. Accordingly, the radicals are supplied to the housing 120 by the baffle 500, and introduction of the ions and electrons into the housing 120 is interrupted. The baffle 500 is fixed to the process chamber 60. As an example, the baffle 500 may be coupled to a lower end of the plasma generating chamber 140.

Figure 3:
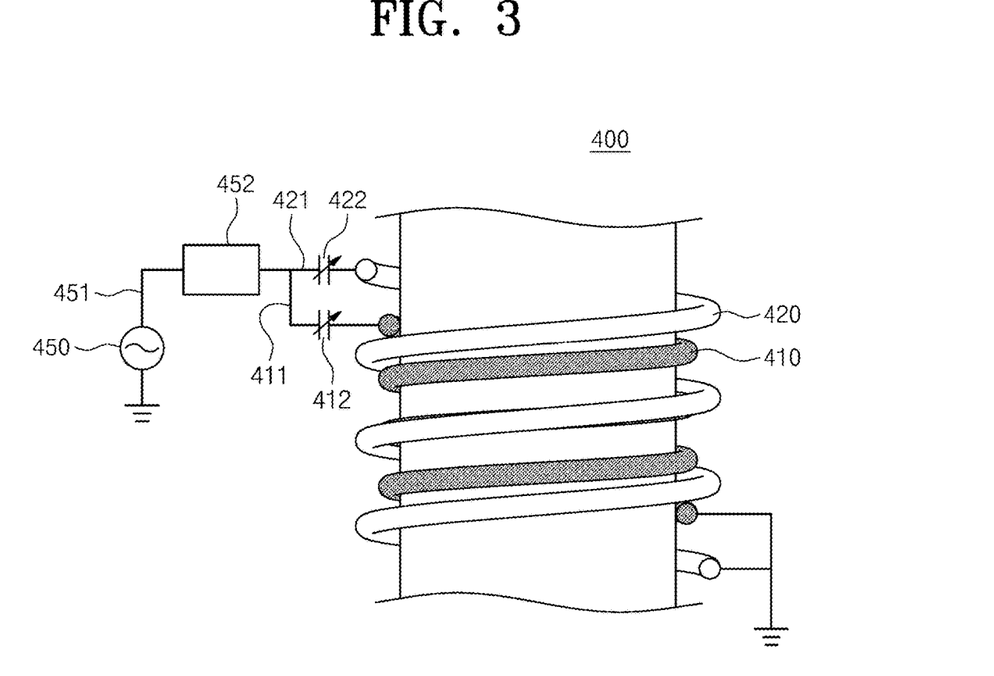
FIG. 3 is a view illustrating an antenna unit.

FIG. 3 is a view illustrating an antenna unit.

Referring to FIG. 3, the antenna unit 400 includes a first antenna 410, a second antenna 420, and power distributing members 412 and 422.

The first antenna 410 is provided to surround an outer circumference of the plasma generating chamber 140 a plurality of times from a first location corresponding to an upper end of the plasma generating chamber 140 to a second location corresponding to a lower end of the plasma generating chamber 140. The first antenna 410 may be wound at a regular interval. The first antenna 410 is connected to a main electric wire 451 connected to a power source 450 through a first electric wire 411. A first power distributing member 412 is located in series in the first electric wire 411. The first power distributing member 412 may be a first variable capacitor. A matching circuit 452 may be located in the main electric wire 451. The matching circuit 452 may perform impedance matching.

The second antenna 420 is provided to surround an outer circumference of the plasma generating chamber 140 a plurality of times from a third location corresponding to an upper end of the plasma generating chamber 140 to a fourth location corresponding to a lower end of the plasma generating chamber 140. The second antenna 420 may be wound at a regular interval. Intervals between windings of the second antenna 420 may be smaller than intervals between windings of the first antenna 410. The second antenna 420 is provided to be wound in the same direction as the first antenna 410. Accordingly, if the power source 450 is applied to the first antenna 410 and the second antenna 420, magnetic fluxes in the same direction are formed. The second antenna 420 is provided over an area that is different from the first antenna 410.

A length between an upper end and a lower end of the plasma generating chamber 140, on which the second antenna 420 is wound, is longer than a length between an upper end and a lower end of the plasma generating chamber 140, on which the first antenna 410 is wound. As an example, the second antenna 420 may be provided to include an area in which the first antenna 410 is wound. An upper end of the second antenna 420 may be located above an upper end of the first antenna 410. A lower end of the second antenna 420 may be located below a lower end of the first antenna 410.

The second antenna 420 is connected to the main electric wire 451 through the second electric wire 421, and the second antenna 420 is connected to the power source 450 to be connected in parallel to the first antenna 410. A second power distributing member 422 is located in series in the second electric wire 421. The second power distributing member 422 may be a second variable capacitor.

Figure 4:
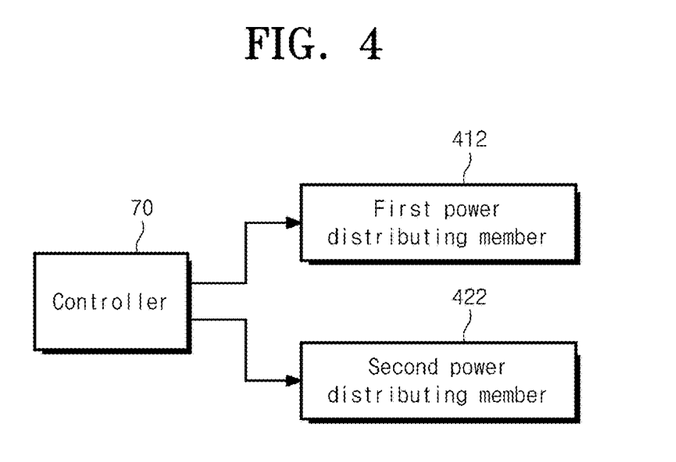
FIG. 4 is a view illustrating some control relationships of the process module.
Figure 5:
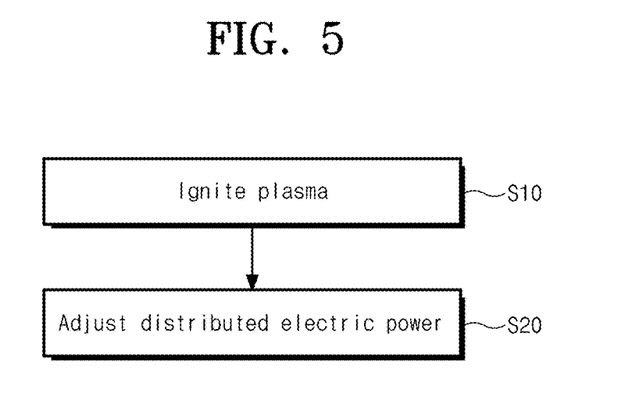
FIG. 5 is a view illustrating a process of adjusting an antenna unit.

FIG. 4 is a view illustrating some control relationships of the process module. FIG. 5 is a view illustrating a process of adjusting an antenna unit.

Referring to FIGS. 4 and 5, the controller 70 may control elements of the substrate treating apparatus 1. The controller 70 may control the first power distributing member 412 and the second power distributing member 422.

If the treated substrate is carried in and is located in the support unit 200, the ignition of plasma is achieved (S10). For the ignition of plasma, the controller 70 initiates supply of the gas through the gas supply member 320, and supplies electric power to the antenna unit 400 through the power source 450. The power source 450 initiates supply of electric power at the same time when the gas supply member 320 initiates supply of gas. Further, the power source 450 may initiate supply of electric power prior to the supply of the gas by the gas supply member 320 by a preset time period, or may initiate supply of electric power after a preset time period elapses from the supply of the gas by the gas supply member 320. If electric power is supplied to the antenna, the gas is ignited into a plasma state by an electromagnetic field formed by the antenna.

During the ignition of plasma, the controller 70 applies electric power that is higher than electric power applied to the second antenna 420 to the first antenna 410. To achieve this, the controller 70 makes a reactance of the first power distributing member 412 lower than a reactance of the second power distributing member 422 by making a capacitance of the first power distributing member 412 higher than a capacitance of the second power distributing member 422. As an example, the controller 70 may maximize the capacitance of the first power distributing member 412, and may minimize the capacitance of the second power distributing member 422.

If an electric potential per unit distance is not sufficiently formed when the ignition of plasma is initiated, the plasma is not smoothly generated. Meanwhile, in the substrate treating apparatus 1 according to the inventive concept, an electric potential per unit distance increases by applying a high voltage to the first antenna 410, of which a length between an upper end and a lower end thereof is relatively short, when the ignition of the plasma is initiated. Accordingly, during the ignition of the plasma, the generation of the plasma may be smoothly initiated.

If the ignition of the plasma is initiated, the plasma includes charged particles so that a mutual inductance is generated between the antenna unit 400 and the plasma. Due to the mutual inductance by the plasma, a current flowing through the first antenna 410 is influenced by the state of the plasma. Immediately after the ignition of the plasma is initiated, the quantity, density, and distribution of the plasma are unstable so that the current flowing through the first antenna 410 also becomes unstable. Further, if the state of the plasma becomes stable over time, the current flowing through the first antenna 410 also becomes close to a normal state.

If a preset time period elapses after the ignition of the plasma is initiated and the state of the plasma becomes stable, the controller 70 adjusts electric power distributed to the first antenna 410 and the second antenna 420 (S20). The controller 70 may perform a control such that electric power that is higher than electric power applied to the first antenna 410 is applied to the second antenna 420. To achieve this, the controller 70 makes a reactance of the second power distributing member 422 lower than a reactance of the first power distributing member 412 by making a capacitance of the second power distributing member 422 higher than a capacitance of the first power distributing member 412.

As an example, the controller 70 may maximize the capacitance of the second power distributing member 422, and may minimize the capacitance of the first power distributing member 412.

If the plasma is excited by the antenna unit 400, heat is generated in the process. The heat generated by the antenna unit 400 becomes substantially maximal at the lengthwise center of the antenna unit 400. In detail, the heat generated by the first antenna 410 becomes substantially maximal at the lengthwise center of the first antenna 410 and becomes lower as it goes to opposite sides of the first antenna 410. The heat generated by the second antenna 420 becomes substantially maximal at the lengthwise center of the second antenna 420 and becomes lower as it goes to opposite sides of the second antenna 420.

The second antenna 420 is distributed over an area that is longer than the first antenna 410. Accordingly, the heat generated in a process of exciting plasma is relatively high at a narrow area of the first antenna 410 and is distributed over a large area of the second antenna 420. Accordingly, if the plasma is excited by applying relatively high electric power to the second antenna 420, the heat generated in the process of exciting plasma may be also distributed to an area in which the second antenna 420 is wound. Accordingly, the heat generated in a process of exciting the plasma is dispersed so that the temperatures of the plasma and the plasma generating chamber 140 may be prevented from being increased excessively.

Figure 6:
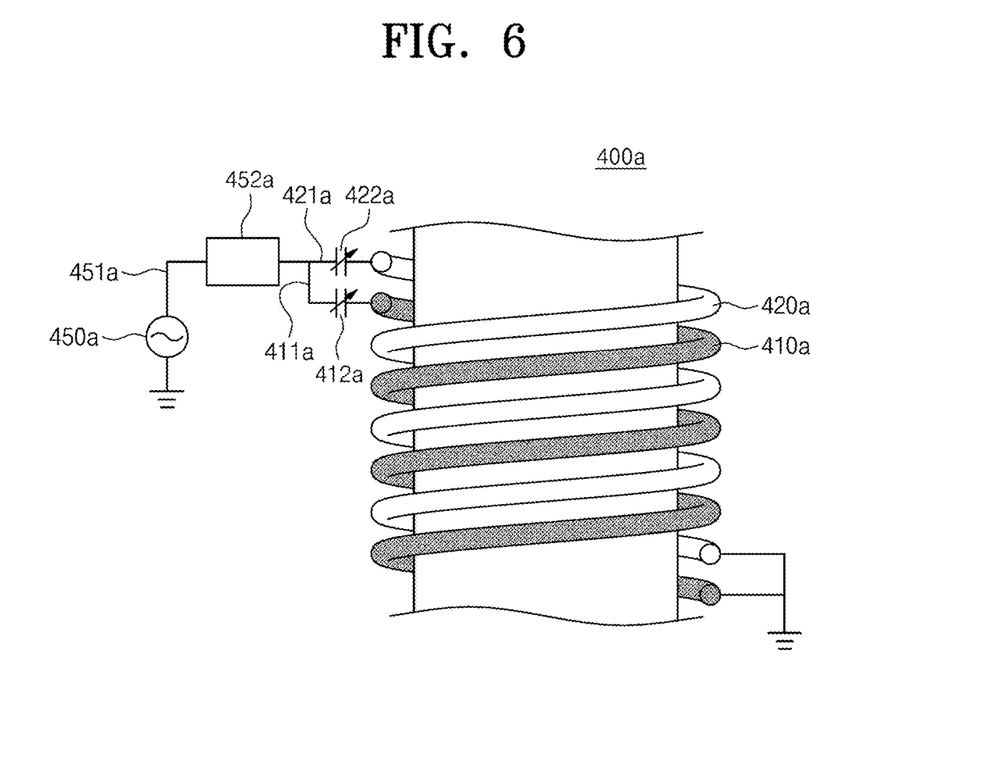
FIG. 6 is a view illustrating an antenna unit according to another embodiment.

FIG. 6 is a view illustrating an antenna unit according to another embodiment.

Referring to FIG. 6, the antenna unit 400a includes a first antenna 410a and a second antenna 420a. The first antenna 410a is provided to surround an outer circumference of the plasma generating chamber 140 a plurality of times. The first antenna 410a may be wound at a regular interval. The first antenna 410a is connected to a main electric wire 451a connected to a power source 450a through a first electric wire 411a. A first power distributing member 412a is located in the first electric wire 411a. The first power distributing member 412a may be a variable capacitor. A matching circuit 452a may be located in the main electric wire 451a.

The second antenna 420a is provided to surround an outer circumference of the plasma generating chamber 140a a plurality of times. The second antenna 420a starts to be wound in the same direction as the first antenna 410a with respect to a direction of a circumference of the plasma generating chamber 140a. Further, the second antenna 420a starts to be wound at a location that is 180° away from a point at which the first antenna 410a starts to be wound, with respect to a direction of a circumference of the plasma generating chamber 140a. The second antenna 420a may be wound at a regular interval. Intervals between windings of the second antenna 420a may be the same as intervals between windings of the first antenna 410a. The second antenna 420a is provided to be wound in the same direction as the first antenna 410a. Accordingly, if an electric voltage is applied to the first antenna 410a and the second antenna 420a, magnetic fluxes in the same direction are formed. The second antenna 420a is connected to the main electric wire 451a through the first electric wire 411a, and the second antenna 420a is connected to the power source 450a to be connected in parallel to the first antenna 410a. A second power distributing member 421a is located in the second electric wire 422a. The second power distributing member 422a may be a variable capacitor.

The second antenna 420a is provided over an area that is different from the first antenna 410a. As an example, the second antenna 420a and the first antenna 410a is provided such that only portions thereof overlap each other. Accordingly, a point (a lengthwise center of the first antenna or a point corresponding to a half of the windings of the first antenna) at which the highest heat is generated in the first antenna 410a and a point (a lengthwise center of the second antenna or a point corresponding to a half of the windings of the second antenna) at which the highest heat is generated in the second antenna 410a are spaced apart from each other by a preset distance.

During the ignition of plasma, the controller 70 applies electric power that is higher than electric power applied to one of the first antenna 410a and the second antenna 420a to the other one. To achieve this, the controller 70 may make a capacitance of one of the first power distributing member 412a and the second power distributing member 422a higher than a capacitance of the other one. As an example, the controller 70 may maximize the capacitance of one of the first power distributing member 412a and the second power distributing member 422a, and may minimize the capacitance of the other one. Further, the ignition of the plasma may be initiated while the same electric power is applied to the first antenna 410a and the second antenna 420a.

Thereafter, the controller 70 may change the electric power applied to the first antenna 410a and the second antenna 420a. The change of the applied electric power may be achieved after the ignition of the plasma is initiated and a preset time period elapses.

As an example, when the ignition of the plasma is initiated while a capacitance of the first power distributing member 412a is higher than that of the second power distributing member 422a, for example, while the capacitance of the first power distributing member 412a is maximal and the capacitance of the second power distributing member 422a is minimal, the capacitance of the first power distributing member 412a decreases and the impedance of the first power distributing member 412a increases and the capacitance of the second power distributing member 422a increases and the impedance of the second power distributing member 422a decreases, at a time point at which a preset time period elapses. The capacitance of the first power distributing member 412a decreases until it becomes minimal, and the capacitance of the second power distributing member 422a increases until it becomes maximal. Accordingly, a state in which relatively high electric power is applied to the first antenna 410a is converted to a state in which relatively high electric power is applied to the second antenna 420a. Further, a portion at which most heat is generated is moved from the lengthwise center of the first antenna 410a to the lengthwise center of the second antenna 420a. Thereafter, the electric power applied to the first antenna 410a and the second antenna 420a may be changed in a form in which the impedance of the first power distributing member 412a decreases and the impedance of the second power distributing member 422a increases. The adjustment of the electric power applied to the first antenna 410a and the second antenna 420a may be performed one or more times while the substrate is treated. The substrate treating apparatus according to an embodiment of the inventive concept may prevent a heat generating area from being concentrated so that equipment is damaged or particles are generated, by distributing an area in which heat is generated in a form in which a portion at which most heat is generated in a process of exciting plasma is moved.

Figure 7:
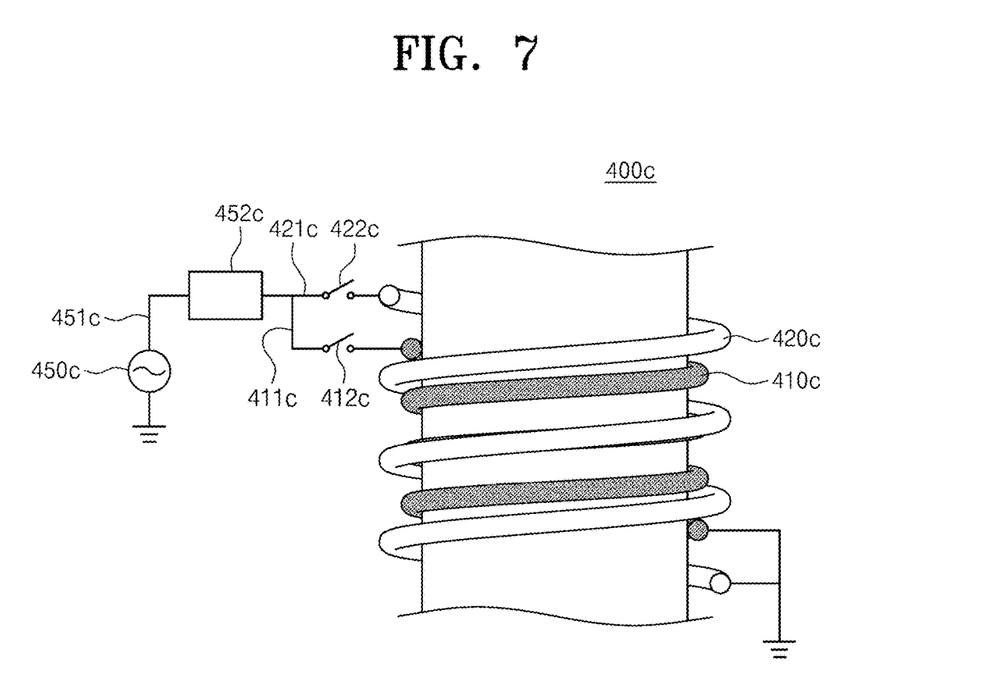
FIG. 7 is a view illustrating an antenna unit according to another embodiment.

FIG. 7 is a view illustrating an antenna unit according to another embodiment.

Referring to FIG. 7, the antenna unit 400c includes a first antenna 410c and a second antenna 420c.

The first power distributing member 412c located in the first electric wire 411c and connected in series to the first antenna 410c may be provided as a first switch. The second power distributing member 422c located in the second electric wire 421c and connected in series to the second antenna 420c may be provided as a second switch. When the ignition of the plasma is initiated, the first power distributing member 412c is switched on, the second power distributing member 422c is switched off, and electric power may be supplied only to the first antenna 410c. Thereafter, if a preset time period elapses, the second power distributing member 422c is switched on and electric power may be supplied to the first antenna 410c and the second antenna 420c. Thereafter, if a preset time period elapses, the first power distributing member 412c is switched off and electric power may be supplied only to the second antenna 420c. The adjustment of the distributed power may be performed one or more times while the substrate is treated.

The configurations and operations of the first antenna 410c, the second antenna 420c, and the matching circuit 452c, except for the power distributing members 412c and 422c are the same as those of the antenna unit 400 of FIG. 2 or the antenna unit 400a of FIG. 6, and thus a repeated description thereof will be omitted.

According to an embodiment of the inventive concept, a substrate treating apparatus that efficiently treats a substrate, a substrate treating method, and a plasma generating unit may be provided.

According to an embodiment of the inventive concept, a substrate treating apparatus that efficiently excites plasma, a substrate treating method, and a plasma generating unit may be provided.

According to an embodiment of the inventive concept, a substrate treating apparatus that may control heat generated in a process of exciting plasma, a substrate treating method, and a plasma generating unit may be provided.

The above description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate treating apparatus comprising:
   a housing configured to provide a treatment space, in which a substrate is treated;
   a support unit configured to support the substrate in the treatment space; and
   a plasma generating unit disposed outside the housing and configured to excite plasma from a gas and supply the excited plasma to the treatment space,
   wherein the plasma generating unit includes:
      a plasma generating chamber having a space, into which the gas is introduced;
      a first antenna wound to surround the plasma generating chamber and connected to a power source through a first electric wire;
      a second antenna wound to surround the plasma generating chamber and connected to the power source through a second electric wire to be disposed in parallel to the first antenna; and
      power distributing members provided in the first antenna and the second antenna to distribute electric power supplied from the power source to the first antenna and the second antenna,
   wherein the first antenna is wound a plurality of times from a first location to a second location, and the second antenna is wound a plurality of times from a third location to a fourth location,
   wherein the first location is higher than the second location, and the third location is between the first location and the second location, and
   wherein intervals between windings of the first antenna are the same, intervals between windings of the second antenna are the same, and the intervals between the windings of the second antenna are smaller than the intervals of the windings of the first antenna.

2. The substrate treating apparatus of claim 1, wherein the power distributing members are variable capacitors.

3. The substrate treating apparatus of claim 1, further comprising:

a matching circuit located in a main electric wire connecting the power source to the first electric wire and the second electric wire.

4. The substrate treating apparatus of claim 1, wherein the power distributing members include:
   a first variable capacitor located in the first electric wire; and
   a second variable capacitor located in the second electric wire.

5. The substrate treating apparatus of claim 1, wherein the fourth location is higher than the second location.

6. The substrate treating apparatus of claim 1, wherein the second antenna starts to be wound in the same direction as the first antenna with respect to a direction of a circumference of the plasma generating chamber.

7. The substrate treating apparatus of claim 1, wherein the second antenna starts to be wound at a location that is 180° away from a point at which the first antenna starts to be wound with respect to a direction of a circumference of the plasma generating chamber.

8. The substrate treating apparatus of claim 1, further comprising:
   a controller configured to control the power distributing members such that ignition of plasma is initiated while electric power applied to the first antenna is higher than electric power applied to the second antenna.

9. The substrate treating apparatus of claim 8, wherein the controller decreases the electric power applied to the first antenna and increases the electric power applied to the second antenna when a preset time period elapses after the ignition of the plasma is initiated.

10. The substrate treating apparatus of claim 8, wherein the controller controls the power distributing members such that the electric power applied to the first antenna is higher than the electric power applied to the second antenna when a preset time period elapses after the ignition of the plasma is initiated.

11. A substrate treating method comprising:
   initiating ignition of plasma by applying electric power, which is higher than electric power applied to a second antenna, to a first antenna; and
   when a preset time period elapses after the ignition of the plasma is initiated, decreasing the electric power applied to the first antenna and increasing the electric power applied to the second antenna connected in parallel to the first antenna,
   wherein the first antenna is wound a plurality of times from a first location to a second location, and the second antenna is wound a plurality of times from a third location to a fourth location,
   wherein the first location is higher than the second location, and the third location is between the first location and the second location, and
   wherein intervals between windings of the first antenna are the same, intervals between windings of the second antenna are the same, and the intervals between the windings of the second antenna are smaller than the intervals of the windings of the first antenna.

12. The substrate treating method of claim 11, wherein a length from an upper end to a lower end of the first antenna is shorter than a length from an upper end to a lower end of the second antenna.

13. The substrate treating method of claim 11, wherein the ignition of the plasma is initiated while the electric power applied to the first antenna is maximized and the electric power applied to the second antenna is minimized.

14. The substrate treating method of claim 11, wherein when the ignition of the plasma is initiated and a preset time period elapses, the electric power applied to the first antenna is minimized and the electric power applied to the second antenna is maximized.

15. The substrate treating method of claim 11, wherein electric power is distributed to the first antenna and the second antenna by utilizing variable capacitors.

16. The substrate treating method of claim 11, wherein electric power is distributed to the first antenna and the second antenna by utilizing a first variable capacitor connected in series to the first antenna and a second variable capacitor connected in series to the second antenna.

17. A plasma generating unit comprising:
   a plasma generating chamber having a space, into which a gas is introduced;
   a first antenna wound to surround the plasma generating chamber and connected to a power source through a first electric wire;
   a second antenna wound to surround the plasma generating chamber and connected to the power source through a second electric wire to be disposed in parallel to the first antenna; and
   power distributing members provided in the first antenna and the second antenna to distribute electric power supplied from the power source to the first antenna and the second antenna,
   wherein the first antenna is wound a plurality of times from a first location to a second location, and the second antenna is wound a plurality of times from a third location to a fourth location,
   wherein the first location is higher than the second location, and the third location is between the first location and the second location, and
   wherein intervals between windings of the first antenna are the same, intervals between windings of the second antenna are the same, and the intervals between the windings of the second antenna are smaller than the intervals of the windings of the first antenna.

18. The plasma generating unit of claim 17, wherein the power distributing members include:
   a first variable capacitor located in the first electric wire; and
   a second variable capacitor located in the second electric wire.

19. The plasma generating unit of claim 17, further comprising:
   a controller configured to control the power distributing members such that ignition of plasma is initiated while electric power applied to the first antenna is higher than electric power applied to the second antenna.

20. The plasma generating unit of claim 19, wherein the controller decreases the electric power applied to the first antenna and increases the electric power applied to the second antenna when a preset time period elapses after the ignition of the plasma is initiated.

21. The plasma generating unit of claim 17, wherein a length between an upper end and a lower end of the first antenna is shorter than a length between an upper end and a lower end of the second antenna.

22. The plasma generating unit of claim 17, wherein the power distributing members include:
   a first switch located in the first electric wire; and
   a second switch located in the second electric wire.

23. The plasma generating unit of claim 22, further comprising:

a controller configured to perform a control such that the second switch is switched on when a preset time period elapses after ignition of plasma is initiated while the first switch is switched on and the second switch is switched off.

* * * * *